(12) United States Patent
Han (10) Patent No.: US 9,595,217 B2
(45) Date of Patent: Mar. 14, 2017

(54) TRACE STRUCTURE FOR IMPROVED ELECTRICAL SIGNALING

(71) Applicant: SAMSUNG DISPLAY CO., LTD., Yongin, Gyeonggi-Do (KR)

(72) Inventor: Minghui Han, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/535,216

(22) Filed: Nov. 6, 2014

(65) Prior Publication Data

US 2015/0161929 A1    Jun. 11, 2015

Related U.S. Application Data (60) Provisional application No. 61/912,472, filed on Dec. 5, 2013.

(51) Int. Cl.
| | |
|---|---|
| G09G 3/20 | (2006.01) |
| H05K 1/02 | (2006.01) |
| H05K 1/11 | (2006.01) |
| H01L 23/66 | (2006.01) |

(52) U.S. Cl.
CPC ............ *G09G 3/20* (2013.01); *H05K 1/0242* (2013.01); *H05K 1/0296* (2013.01); *H05K 1/11* (2013.01); *G09G 2300/0404* (2013.01); *G09G 2310/06* (2013.01); *G09G 2310/08* (2013.01); *H01L 23/66* (2013.01); *H01L 2924/0002* (2013.01); *H05K 1/025* (2013.01); *H05K 1/0246* (2013.01); *H05K 2201/097* (2013.01); *H05K 2201/09218* (2013.01); *H05K 2201/09727* (2013.01); *H05K 2201/09827* (2013.01); *H05K 2201/10128* (2013.01)

(58) Field of Classification Search
None
See application file for complete search history.

(56) References Cited

U.S. PATENT DOCUMENTS

| | | | |
|---|---|---|---|
| 7,564,695 | B2 | 7/2009 | Matsumoto |
| 8,283,571 | B2 | 10/2012 | Lai et al. |
| 8,749,535 | B2 | 6/2014 | Kim et al. |
| 2004/0125526 | A1 | 7/2004 | Nagode et al. |

(Continued)

FOREIGN PATENT DOCUMENTS

| | | |
|---|---|---|
| EP | 1 326 302 A2 | 7/2003 |
| EP | 1 326 302 A3 | 11/2003 |

(Continued)

OTHER PUBLICATIONS

EPO Search Report dated May 12, 2015, corresponding to European Patent application 14196024.5, (8 pages).

(Continued)

*Primary Examiner* — Jennifer Mehmood
*Assistant Examiner* — Krishna Neupane
(74) *Attorney, Agent, or Firm* — Lewis Roca Rothgerber Christie LLP (57) ABSTRACT

A trace to be coupled to an input of a receiver, the trace including: a plurality of first portions; and a plurality of second portions alternately coupled in series with the first portions, the second portions having a width that is different from that of the first portions.

20 Claims, 6 Drawing Sheets

(56) References Cited

U.S. PATENT DOCUMENTS

| | | | |
|---|---|---|---|
| 2006/0146627 A1* | 7/2006 | Park | G11C 5/063 |
| | | | 365/222 |
| 2009/0152689 A1 | 6/2009 | Nease | |
| 2009/0195327 A1* | 8/2009 | Cho | H01P 3/003 |
| | | | 333/34 |
| 2010/0085084 A1 | 4/2010 | Kim et al. | |
| 2011/0284279 A1 | 11/2011 | Lai et al. | |
| 2014/0176412 A1 | 6/2014 | Oh | |
| 2015/0109227 A1* | 4/2015 | Shin | G06F 3/044 |
| | | | 345/173 |
| 2015/0207541 A1 | 7/2015 | Kuroda | |

FOREIGN PATENT DOCUMENTS

| | | |
|---|---|---|
| GB | 1131115 | 10/1968 |
| JP | 2007-012661 | 1/2007 |
| KR | 10-2002-0013504 A | 2/2002 |
| KR | 10-2002-0054900 A | 7/2002 |
| KR | 10-2008-0022407 A | 3/2008 |
| KR | 10-2010-0038825 | 4/2010 |

OTHER PUBLICATIONS

Office Action dated Nov. 2, 2015 in corresponding U.S. Appl. No. 14/696,311, 17 pages.

\* cited by examiner

TRACE STRUCTURE FOR IMPROVED
ELECTRICAL SIGNALING

CROSS-REFERENCE TO RELATED APPLICATION

This utility patent application claims priority to and the benefit of U.S. Provisional Patent Application Ser. No. 61/912,472, filed Dec. 5, 2013, entitled "A Grating-Like Metal Structure for Improved Electrical Signaling," the entire content of which is incorporated herein by reference.

BACKGROUND

Channel loss is a primary limiting factor when transmitting electrical signals over long distances at multi-Gbps data rates. Existing solutions focus on equalization schemes inside the transmitter and receiver chips, such as finite impulse response filters (FIRs), continuous time linear equalizers (CTLEs), and decision feedback equalizers (DFEs). However, these chip-level solutions are process technology dependent, have relatively high power consumption, and have performance variation across different process, voltage, and temperature (PVT) corners.

The above information disclosed in this Background section is only for enhancement of understanding of the background of the invention and therefore it may contain information that does not form the prior art that is already known to a person of ordinary skill in the art.

SUMMARY

Aspects of embodiments of the present invention relate to a data channel for increasing the quality of received signals.

According to an embodiment of the present invention, a display device includes: a display; a transmitter coupled to the display; a receiver coupled to the transmitter; and a trace coupled between the transmitter and the receiver, the trace including: a plurality of first portions; and a plurality of second portions alternately coupled in series with the first portions, the second portions having a width that is different from that of the first portions.

The width of a first portion from among the first portions may be constant from a first end of the first portion to a second end of the first portion, and the width of a second portion from among the second portions may be constant from a first end of the second portion to a second end of the second portion.

The width of a first portion from among the first portions may be smaller than the width of a second portion from among the second portions, and the width of the first portion may increase from a first end of the first portion to a second end of the first portion, and the width of the second portion may increase from a first end of the second portion to a second end of the second portion.

The width of a first portion from among the first portions may be larger than the width of a second portion from among the second portions, and the width of the first portion may decrease from a first end of the first portion to a second end of the first portion, and the width of the second portion may decrease from a first end of the second portion to a second end of the second portion.

The trace may include a plurality of periods, each of the periods may include one of the first portions and an adjacent one of the second portions, and a length of each of the periods may be equal to each other.

According to another embodiment of the present invention, a circuit board includes: a first terminal to be coupled to a transmitter; a second terminal to be coupled to a receiver; and a trace coupled between the first terminal and the second terminal, the trace including: a plurality of first portions; and a plurality of second portions alternately coupled in series with the first portions, the second portions having a width that is different from that of the first portions.

The width of a first portion from among the first portions may be constant from a first end of the first portion to a second end of the first portion, and the width of a second portion from among the second portions may be constant from a first end of the second portion to a second end of the second portion.

The width of a first portion from among the first portions may be smaller than the width of a second portion from among the second portions, and the width of the first portion may increase from a first end of the first portion to a second end of the first portion, and the width of the second portion may increase from a first end of the second portion to a second end of the second portion:

The width of a first portion from among the first portions may be larger than the width of a second portion from among the second portions, and the width of the first portion may decrease from a first end of the first portion to a second end of the first portion, and the width of the second portion may decrease from a first end of the second portion to a second end of the second portion.

The trace may include a plurality of periods, each of the periods may include one of the first portions and an adjacent one of the second portions, and a length of each of the periods may be equal to each other.

According to another embodiment of the present invention, a trace to be coupled to an input of a receiver includes: a plurality of first portions; and a plurality of second portions alternately coupled in series with the first portions, the second portions having a width that is different from that of the first portions.

The width of a first portion from among the first portions may be constant from a first end of the first portion to a second end of the first portion, and the width of a second portion from among the second portions may be constant from a first end of the second portion to a second end of the second portion.

Each one of the first portions and the second portions may have a quadrilateral shape.

The width of a first portion from among the first portions may be smaller than the width of a second portion from among the second portions, and the width of the first portion may increase from a first end of the first portion to a second end of the first portion, and the width of the second portion may increase from a first end of the second portion to a second end of the second portion.

Each one of the first portions and the second portions may have a trapezoidal shape or any suitable shape.

The width of a first portion from among the first portions may be larger than the width of a second portion from among the second portions, and the width of the first portion may decrease from a first end of the first portion to a second end of the first portion, and the width of the second portion may decrease from a first end of the second portion to a second end of the second portion.

Each one of the first portions and the second portions may have a trapezoidal shape or any suitable shape.

The trace may further include a plurality of periods, each of the periods may include one of the first portions and an adjacent one of the second portions, and a length of each of the periods may be equal to each other.

Each of the first portions may have a quadrilateral shape, each of the second portions may have a quadrilateral shape, and the width of the first portions may be smaller than the width of the second portions.

Each of the periods may have a trapezoidal shape or any suitable shape.

BRIEF DESCRIPTION OF THE DRAWINGS

The above and other aspects and features of the present invention will become apparent to those skilled in the art from the following detailed description of the example embodiments with reference to the accompanying drawings.

DETAILED DESCRIPTION

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey some of the aspects and features of the present invention to those skilled in the art. Accordingly, processes, elements, and techniques that are not necessary to those having ordinary skill in the art for a complete understanding of the aspects and features of the present invention are not described with respect to some of the embodiments of the present invention. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises" and/or "comprising," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," or "coupled to" another element or layer, it can be directly on, connected to, or coupled to the other element or layer, or one or more intervening elements or layers may be present. However, when an element or layer is referred to as being "directly on," "directly connected to," or "directly coupled to" another element or layer, there are no intervening elements or layers present.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
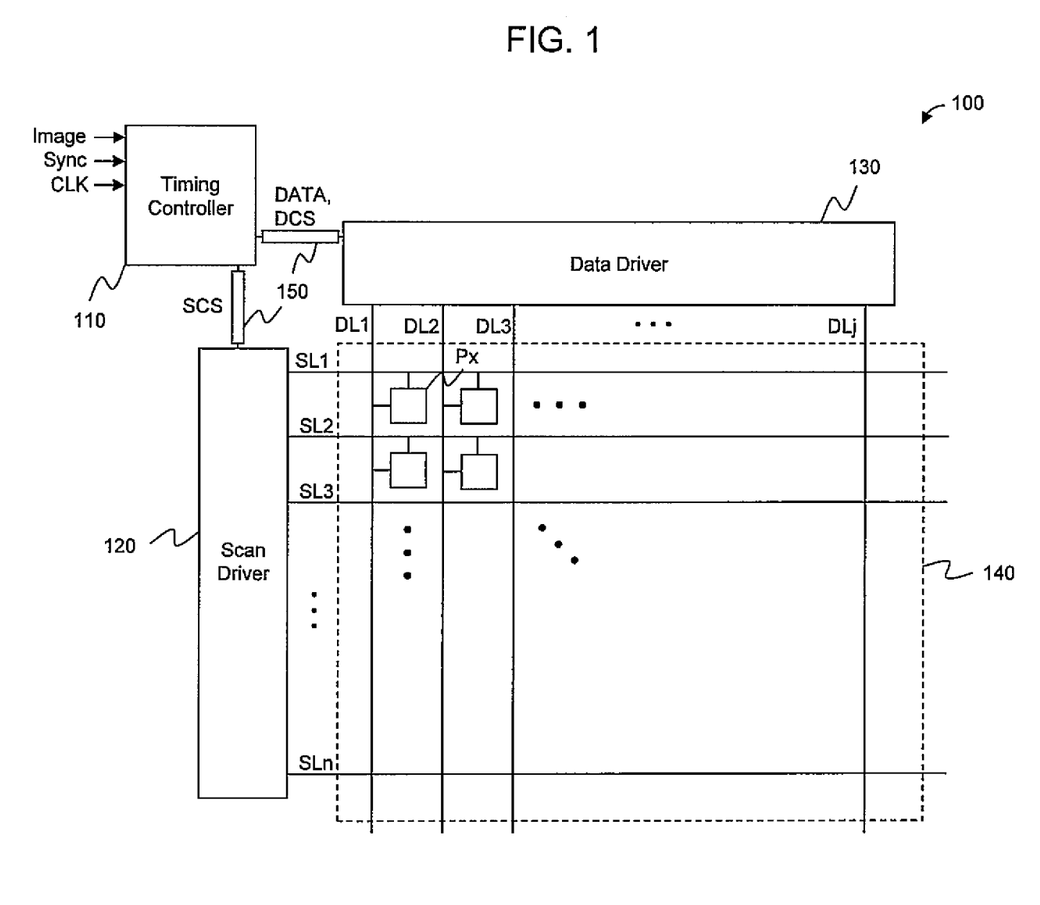
FIG. 1 illustrates an example application of a non-uniform trace structure in the context of a display device according to some embodiments of the present invention.

FIG. 1 illustrates an example application of a non-uniform trace structure in the context of a display device according to some embodiments of the present invention.

Referring to FIG. 1, a display device 100 includes a timing controller 110, a scan driver 120, a data driver 130, and a plurality of pixels Px in a display area 140. Each of the plurality of pixels Px is coupled to respective ones of the scan lines SL1 to SLn, where n is a positive integer, and data lines DL1 to DLj, where j is a positive integer, at crossing portions of the scan lines SL1 to SLn and the data lines DL1 to DLj. Each of the pixels Px receives a data signal from the data driver 130 through the respective one of the data lines DL1 to DLj, when a scan signal is received from the scan driver 120 through a respective one of the scan lines SL1 to SLn.

The timing controller 110 receives an image signal Image, a synchronization signal Sync, and a clock signal CLK from an external source (e.g., external to the timing controller). The timing controller 110 generates image data DATA, a data driver control signal DCS, and a scan driver control signal SCS. The synchronization signal Sync may include a vertical synchronization signal Vsync and a horizontal synchronization signal Hsync.

The timing controller 110 is coupled to (e.g., connected to) the data driver 130 and the scan driver 120 through respective ones of the data lanes 150 (e.g., data line, data path, data bus, etc.). The timing controller 110 transmits the image data Data and the data driver control signal DCS to the data driver 130, and transmits the scan driver control signal SCS to the scan driver 120 through the respective ones of the data lanes 150. Each of the data lanes 150 according to embodiments of the present invention may have the same or substantially the same structure as any ones of data lanes 250 described in detail with reference to FIGS. 2 through 3B below.

Figure 2:
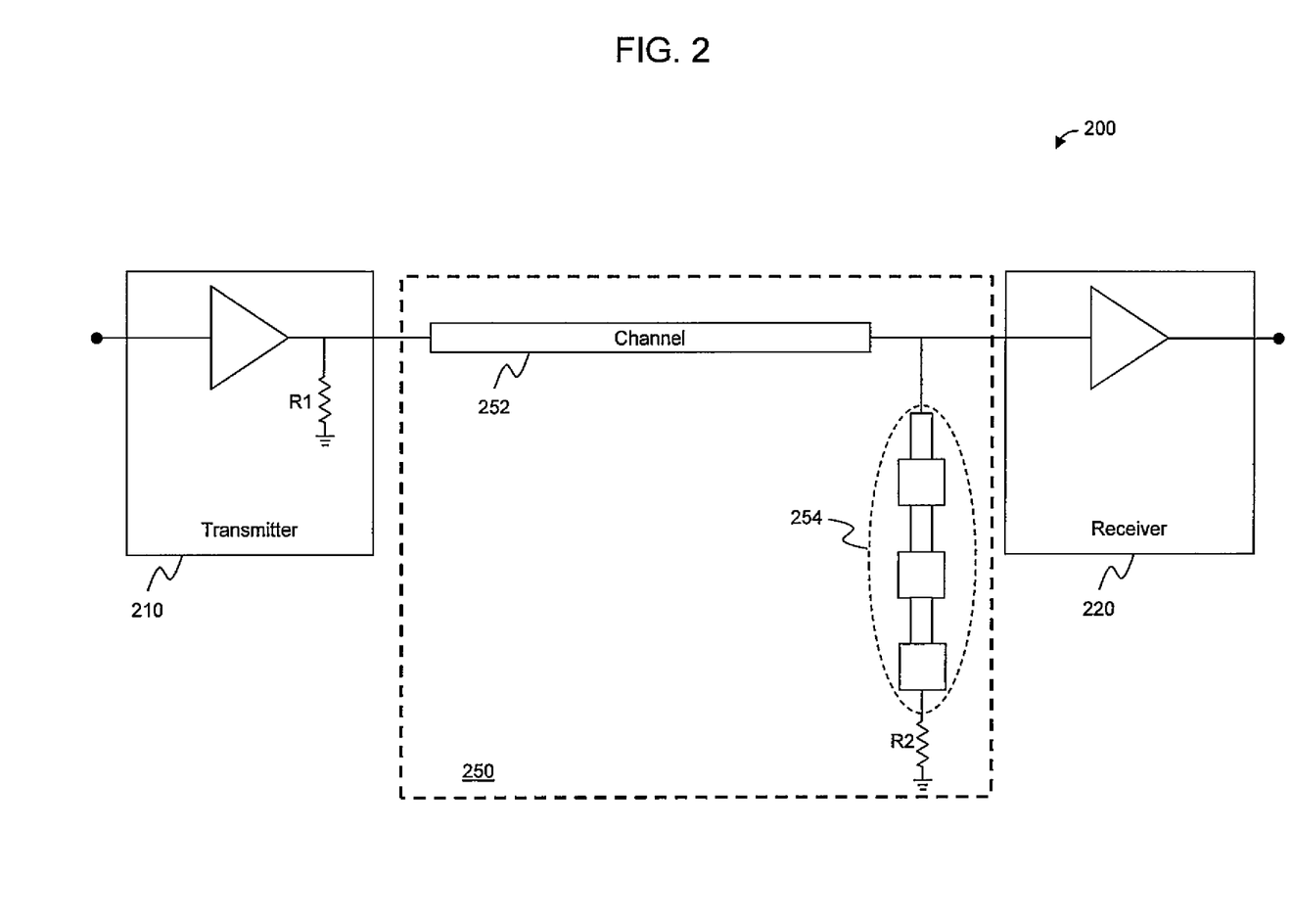
FIG. 2 is a schematic diagram illustrating a data lane for transmitting signals between devices, according to some embodiments of the present invention.

FIG. 2 is a schematic diagram illustrating an example of a data lane (e.g., the data lane 150 shown in FIG. 1) for transmitting signals between devices, according to an embodiment of the present invention.

Referring to FIG. 2, a circuit or circuit board 200 includes a transmitter 210, a receiver 220, and a data lane 250 coupling (e.g., connecting) the transmitter 210 to the receiver 220. The circuit board 200 may include any suitable circuit structure, for example, a printed circuit board (PCB) or a flexible printed circuit board (FPCB), but the present invention is not limited thereto.

The data lane 250 includes a channel 252 for transmitting a signal (e.g., an electronic signal) from the transmitter 210 to the receiver 220, and a non-uniform trace 254 (e.g., a non-uniform trace having a grating-like structure) near (or at) a portion of the channel 252 that is coupled to an input of the receiver 220. As will be further discussed in detail below with reference to FIGS. 3A and 3B, the non-uniform trace 254 enhances (e.g., selectively enhances) reflection of the signal propagating through the channel 252 at particular frequencies (e.g., predetermined frequencies) to the input of the receiver 220.

The non-uniform trace 254 is terminated with a resistor R2 for reflection control, and to set a DC bias of the input of the receiver 220. The resistor R2 may have the same or substantially the same impedance value as that of the channel 252, and the input of the receiver 220 may be left unterminated as shown in FIG. 2. However, the present invention is not limited thereto. For example, the impedance of the resistor R2 may be any suitable impedance, and the input of the receiver 220 may be terminated within the receiver chip as well. For example, the impedance of the resistor R2 may be experimentally determined based on a desired reflection property of the non-uniform trace 254. If the input of the receiver 220 is also terminated within the receiver chip, the reflection properties of the non-uniform trace 254 may be fine-tuned with various different combinations of the impedance value of the resistor R2 and the impedance value of the terminated input within the receiver chip.

Figure 3A:
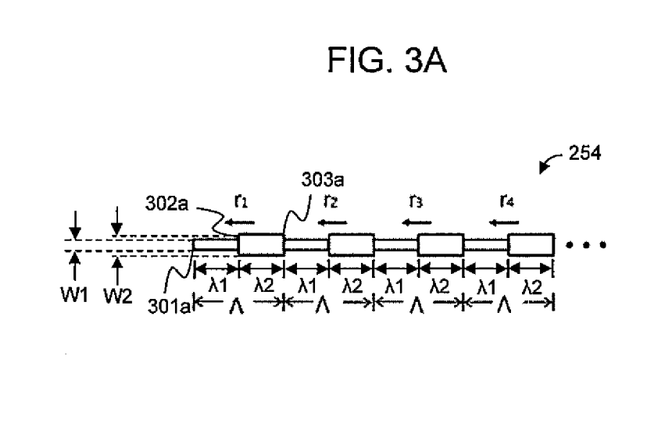
FIGS. 3A and 3B are plan views illustrating various non-uniform trace structures included in the data lane shown in FIG. 2, according to some embodiments of the present invention.
Figure 3B:
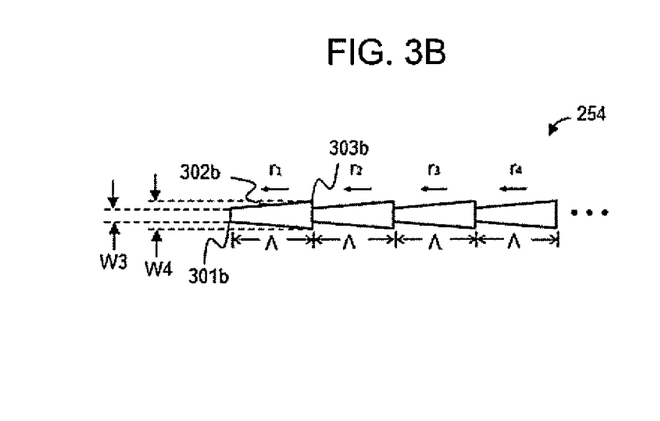

FIGS. 3A and 3B are plan views illustrating various different non-uniform trace structures 254 included in the data lane 250 shown in FIG. 2, according to some embodiments of the present invention.

As shown in FIGS. 3A and 3B, the non-uniform trace 254 includes a plurality of periods r1 through r4. The number of periods may determine the amplitude of the reflected frequency. For example, a greater number of periods, may increase the resonance peak of the transmitted signal. FIGS. 3A and 3B show four periods r1 through r4, but the present invention is not limited thereto, and the number of periods may vary according to a desired depth of the ratio between the peak of the reflected frequency and the length of the frequency, as well as an amount of physical space available within the circuit board 200.

Referring to FIG. 3A, according to some embodiments, each of the periods r1 through r4 has a length $\Lambda$ (e.g., a physical length) and a plurality of widths along a direction perpendicular to the length $\Lambda$. Accordingly, for each period, the width of the periods of the non-uniform trace 254 may vary at different sections along the length $\Lambda$. In some embodiments, the length $\Lambda$ of each period r1 through r4 may be equal to or substantially equal to each other, but the present invention is not limited thereto.

According to one embodiment, each of the periods r1 through r4 includes a first portion 301a, a second portion 303a opposite the first portion 301a, and a middle portion 302a coupling (e.g., connecting or between) the first portion 301a and the second portion 303a. A width W1 of the first portion 301a is different from (e.g., less than) a width W2 of the second portion 303a. The width W1 of the first portion 301a may be constant or substantially constant from a first end of the first portion 301a to a second end of the first portion 301a, and the width W2 of the second portion 303a may be constant or substantially constant from a first end of the second portion 303a to a second end of the second portion 303a. However, the present invention is not limited thereto.

In some embodiments, a plurality of second portions may be alternately coupled in series with a plurality of first portions. For example, the first portion 301a of the second period r2 is coupled to the second portion 303a of the first period r1, and the first portions 301a of each subsequent period are coupled to the second portions 303a of respective previous periods to form the non-uniform trace 254.

In some embodiments, the first portion 301a may have a quadrilateral shape including four right angles and four sides. Two of the sides that are parallel to each other may extend in a first direction and may each have a height equal to the width W1. Two of the other sides that are parallel to each other may extend in a second direction and may each have a length equal to a first length $\lambda 1$. The first length $\lambda 1$ may be greater than the width W1. The first direction may extend along the width W1 direction and the second direction may extend along the length $\Lambda$ direction. However, the present invention is not limited thereto, for example, the quadrilateral shape may include no right angles and/or each of the four sides may be equal in length to each other.

In some embodiments, the second portion 303a may have a quadrilateral shape including four right angles and four sides. Two of the sides that are parallel to each other may extend in the first direction and may each have a height equal to the width W2. Two of the other sides that are parallel to each other may extend in the second direction and may each have a length equal to a second length λ2. The second length λ2 may be greater than the width W2. However, the present invention is not limited thereto, for example, the quadrilateral shape may include no right angles and/or each of the four sides may be equal in length to each other.

In one embodiment, the first length λ1 may be equal to or substantially equal to the second length λ2. However, the present invention is not limited thereto, and the first length λ1 may be less than the second length λ2, or the first length λ1 may be greater than the second length λ2.

The middle portion 302a includes at least one location where the width varies. That is, the middle portion 302a according to some embodiments of the present invention may include one or more step portions at which the width varies, but as will be described further below with reference to FIG. 3B, the present invention is not limited thereto.

In some embodiments, the middle portion 302a may be a section along the length Λ where the width W1 of the first portion 302a and the width W2 of the second portion 303a meet.

FIG. 3A shows that the width W1 of the first portion 301a is smaller than the width W2 of the second portion 303a, but the present invention is not limited thereto, and the width of the first portion 301a may be larger than the width of the second portion 303a depending on whether or not a positive reflection or a negative reflection is desired for the particular application. For example, if the first portion 301a has a larger width W1 than that of W2 the second portion 303a, the reflection at the period (e.g., at a first end of the period) may be negative, whereas if the first portion 301a has a smaller width W1 than that of W2 the second portion 303a, then the reflection at the period (e.g., the first end of the period) may be positive.

Hereinafter, a non-uniform trace structure 254 will be described according to another embodiment of the present invention with reference to FIG. 3B. Referring to FIG. 3B, according to another embodiment, each of the periods r1 through r4 has a length Λ (e.g., a physical length) and a plurality of widths along a direction perpendicular to the length Λ. Accordingly, for each period, the width of the periods of the non-uniform trace 254 may gradually (e.g., continuously) vary along the length Λ. In some embodiments, the length Λ of each period r1 through r4 may be equal to or substantially equal to one another, but the present invention is not limited thereto.

According to one embodiment, each of the periods r1 through r4 includes a first portion 301b, a second portion 303b opposite the first portion 301b, and a middle portion 302b coupling (e.g., connecting or between) the first portion 301b and the second portion 303b. A width W3 of the first portion 301b is different from (e.g., less than) a width W4 of the second portion 303b.

In some embodiments, a plurality of second portions may be alternately coupled in series with a plurality of first portions. For example, the first portion 301b of the second period r2 is coupled to the second portion 303b of the first period r1, and the first portions 301b of each subsequent period is coupled to the second portions 303b of respective previous periods to form the non-uniform trace 254.

In some embodiments, the first portion 301b may have a width that increases from a first end of the first portion 301b to a second end of the first portion 301b, and the second portion 303b may have a width that increases from a first end of the second portion 303b to a second end of the second portion 303b. However, the present invention is not limited thereto, for example, the first portion 301b may have a width that decreases from the first end of the first portion 301b to the second end of the first portion 301b, and the second portion 303b may have a width that decreases from the first end of the second portion 303b to the second end of the second portion 303b.

In some embodiments, the first portion 301b may be a trapezoidal shape and the second portion 303b may be a trapezoidal shape. However, the present invention is not limited thereto, and the first and second portions 301b and 303b may be any suitable shape (e.g., triangle, diamond, circle, etc.). For example, if the period has a triangular shape, the first portion 301b may have a triangular shape and the second portion 303b may have a trapezoidal shape. If the period has a circular shape, then the first portion 301b may be a semi-circle and the second portion 303b may be a semi-circle.

In some embodiments, the first portion 301b may be a section along the length Λ having the width W3.

In some embodiments, the second portion 303b may be a section along the length Λ having the width W4.

In some embodiments, the middle portion 302b includes at least one location where the width varies. That is, the middle portion 302b according to some embodiments of the present invention may include one or more portions at which the width varies continuously or gradually, but the present invention is not limited thereto.

In some embodiments, the middle portion 302b may extend from the first portion 301b to the second portion 303b. The middle portion 302b may include a first slope gradually (e.g., continuously) increasing from the first portion 301b to the second portion 303b, and may include a second slope gradually (e.g., continuously) decreasing from the first portion 301b to the second portion 303b. The first slope may be a mirror image of the second slope along an axis intersecting center points of the width W3 and the width W4 that is parallel to the length Λ, but the present invention is not limited thereto.

FIG. 3B shows that the width of the first portion 301b is smaller than the width of the second portion 303b, but the present invention is not limited thereto, and the width of the first portion 301b may be larger than the width of the second portion 303b depending on whether or not a positive reflection or a negative reflection is desired based on the particular application. For example, if the first portion 301b has a larger width than that of the second portion 303b, the reflection at the period (e.g., at a first end of the period) may be negative, whereas if the first portion 301b has a smaller width than that of the second portion 303b, then the reflection at the period (e.g., at the first end of the period) may be positive.

As shown in FIG. 3A, the width of each period r1 through r4 may vary abruptly at one or more sections along the length Λ of each period r1 through r4, or as shown in FIG. 3B the width of each period r1 through r4 may gradually (e.g., continuously) vary at multiple sections along the length Λ of each period r1 through r4. Further, FIG. 3A shows each of the periods r1 through r4 including two rectangular shapes having different widths W1 and W2, and FIG. 3B shows each of the periods r1 through r4 including a single trapezium shape in which the width gradually (e.g., continuously) increases from the width W3 to the width W4. However, the manner in which the widths vary and the shape or shapes of the periods are not limited thereto, as long as the width varies at least one section along the length Λ within each of the periods, so that there is reflection at each period. For example, the shape(s) of the periods may include any suitable shape(s) (e.g., a triangle shape, a star shape, a diamond shape, a circle shape, etc.) in which the width(s) of the period varies at least one section along the length Λ.

Accordingly, the non-uniform trace 254 includes a plurality of periods, each period including a length and a plurality of widths at different sections along the length.

As will be described in further detail below, when the signal propagates through the channel 252, the signal is reflected at particular frequencies by the non-uniform trace 254. That is, each period r1 through r4 of the non-uniform trace 254 reflects the signal at particular frequencies according to the period's length Λ and varying widths. Thus, by arranging the periods having the varying widths according to its length Λ, the reflection at each period is combined such that a strong reflection at particular frequencies is enhanced, while having small or minimal reflection at other frequencies.

Accordingly, unlike uniform traces, the non-uniform trace 254 having the plurality of periods with the varying widths allow strong reflection at particular frequencies through constructive interference of multi-path reflection signals. For example, an overall quality of a received signal can benefit from reflection, when the reflection of the signal is more significant at frequencies near a clock rate of the channel than at lower frequencies.

A total reflection of the non-uniform trace 254 peaks at a frequency f defined by equation (1) below, when individual reflections from each period r1 through r4 are in phase with one another.

$$f = \left(n + \frac{1}{2}\right)\frac{v_{\mathit{eff}}}{\Lambda} \qquad (1)$$

In equation (1), Λ is the physical length of each period, $V_{\mathit{eff}}$ is the effective signal propagation speed in each period, and n is an integer greater than or equal to 0 (n>=0).

Thus, as further described in detail with reference to FIGS. 4 and 5, the channel 252 including the non-uniform trace 254 as shown in FIGS. 2, 3A, and 3B, enhances the quality of the signal received by the receiver 220 of both clock signals and arbitrary data sequences transmitted by the transmitter 210 when compared to a channel without the non-uniform trace.

Figure 4:
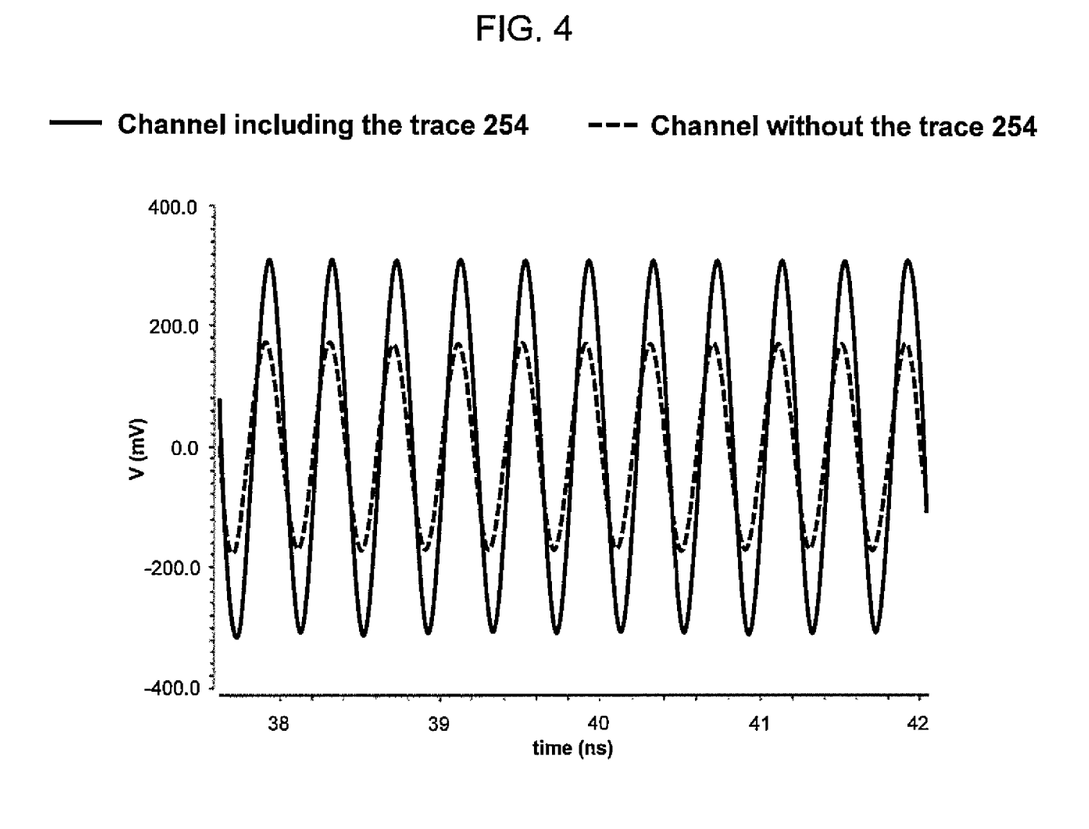
FIG. 4 is a graph comparing received signals at a receiver through a channel including the non-uniform trace according to some embodiments of the present invention, and through a channel without the non-uniform trace.
Figure 5:
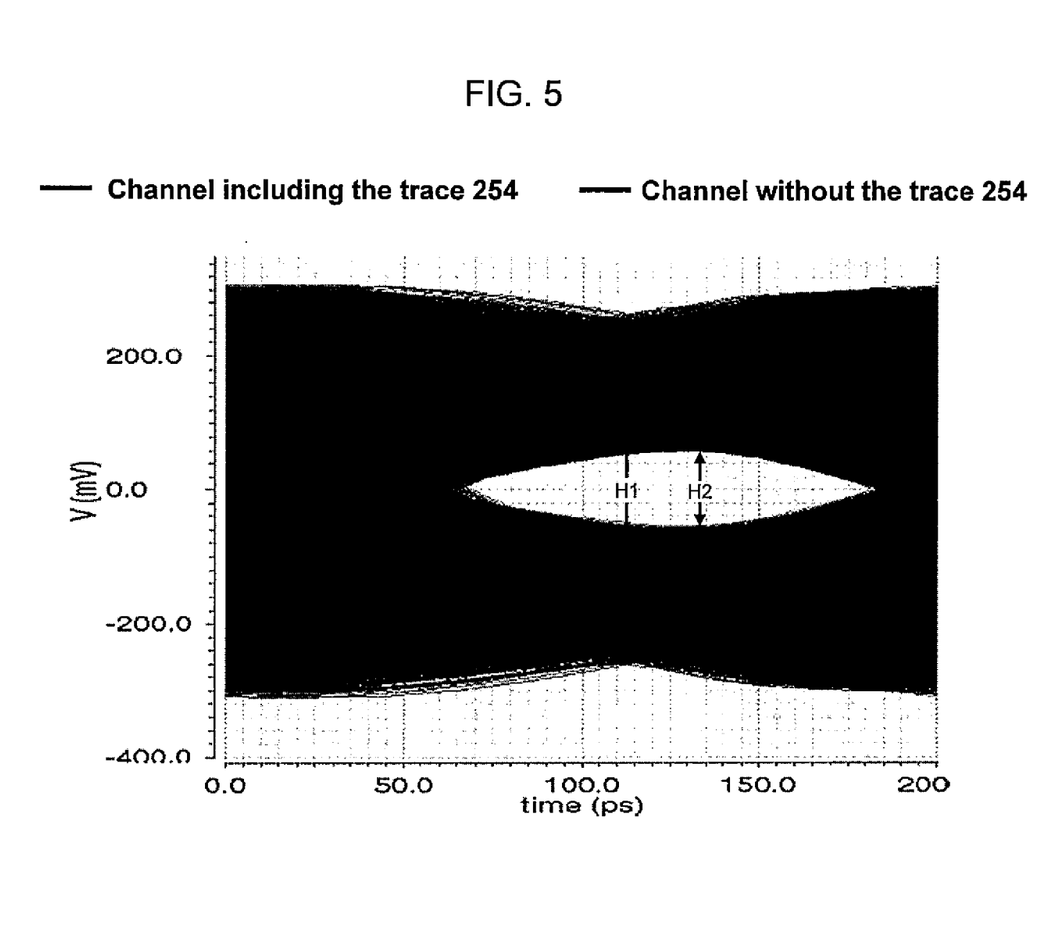
FIG. 5 is an eye-diagram comparing received pseudorandom data sequences at a receiver through a channel including the non-uniform trace according to some embodiments of the present invention, and through a channel without the non-uniform trace.

FIGS. 4 and 5 are graphs comparing the improvement of a signal received by a receiver on a circuit board having the non-uniform trace 254 according to some embodiments of the present invention, and to a circuit board without the non-uniform trace.

Referring to FIGS. 4 and 5, in some embodiments, more than 80% improvement is achieved for a differential link operating at, for example, 5 Gb/s. The original channel on the circuit board is 600 mm long, and the non-uniform trace includes 4 periods, each period being 36 mm long.

FIG. 4 shows a 2.5 GHz clock signal received by a receiver on a circuit board without the non-uniform trace (dotted-line) and a 2.5 GHz clock signal received by a receiver on a circuit board having the non-uniform trace (straight line) according to some embodiments of the present invention. As shown in FIG. 4, the signal received by the receiver on the circuit board including the non-uniform trace 254 has an improved gain (e.g., greater amplitude) than that of the signal received by the receiver on the circuit board without the non-uniform trace.

FIG. 5 shows an eye-diagram of a 5 Gbps pseudorandom binary sequence (PRBS) data sequence received by a receiver on a circuit board without the non-uniform trace (gray area), and received by a receiver on a circuit board having the non-uniform trace (black area) according to some embodiments of the present invention. As shown in FIG. 5, the opening of the eye for the signal received by the receiver having the non-uniform trace 254 has a larger height H1 than the height H2 of the opening of the eye for the signal received by the receiver without the non-uniform trace.

As will be described further below with reference to FIG. 6, the reflection of the signal may be enhanced at particular frequencies according to the period length Λ.

Figure 6:
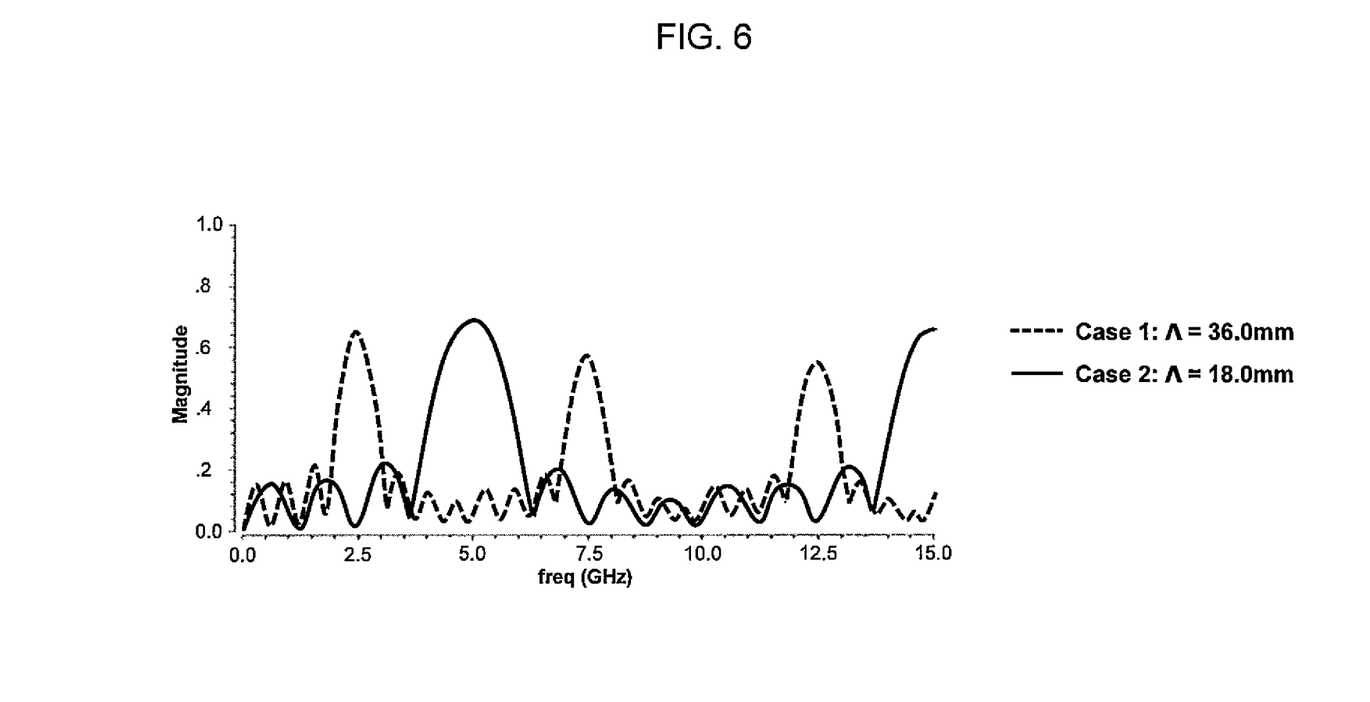
FIG. 6 is a graph illustrating reflective spectrums of non-uniform traces having various period lengths according to some embodiments of the present invention.

FIG. 6 is a graph illustrating reflective spectrums of non-uniform traces having various period lengths Λ according to some embodiments of the present invention.

FIG. 6 shows, for example, the reflective spectrums of differential microstrip traces fabricated on a standard FR4 graded material having a dielectric constant of about 4.0 and a loss tangent of about 0.02. Case 1 (dotted-line) has a period length Λ of about 36 mm, and case 2 (straight line) has a period length Λ of about 18 mm. Each of the non-uniform traces have 4 periods and includes two rectangular shapes, similar to that shown, for example, in FIG. 3A. The first portion has a smaller width than that of the second portion, and has a differential impedance of about 100Ω. The second portion has a larger width than that of the first portion, and has a differential impedance <100Ω. However, the differential impedance of the first and second portions are not limited thereto, and the differential impedance of the first and second portions may be set to any suitable differential impedance. For example, suitable differential impedances of the first and second portions may be determined by rigorous channel simulations.

As shown in FIG. 6, according to some embodiments, the reflection of the signal by the non-uniform trace 254 having varying widths may be enhanced at particular frequencies based on the period length Λ. For example, case 1 having the period length Λ of about 36 mm exhibits greater reflection at frequencies of 2.5 GHz, 7.5 GHz, 12.5 GHz, etc., while having small or minimal reflection at the other frequencies, whereas case 2 having the period length Λ of about 18 mm exhibits greater reflection at frequencies of 5 GHz, 15 GHz, etc., while having small or minimal reflection at the other frequencies. Thus, frequency-selective reflection patterns may be enhanced according to the period length Λ of the non-uniform trace 254 having the varying widths.

Accordingly, in some embodiments of the present invention, channel loss may be compensated for by modifying the original channel on the circuit board to include the non-uniform trace 254 at or near the input of the receiver chip, without additional circuitry in either the transmitter chip or the receiver chip. The non-uniform trace 254 includes a plurality of periods each having a length and varying widths along different sections of the length. Each period selectively reflects the signal propagating through the channel at particular frequencies, which in the aggregate, enhances the signal at those frequencies, while having small or minimal reflection at other frequencies. Thus, the quality of the signal received by the receiver chip may be improved by emphasizing reflection for the selected frequencies at the input of the receiver chip.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims and their equivalents.

What is claimed is:

1. A display device comprising:
   a display;
   a transmitter coupled to the display;
   a receiver coupled to the transmitter;
   a channel coupled to the receiver at a node, and configured to transmit a signal from the transmitter to the receiver; and
   a trace coupled to the channel at the node between the transmitter and the receiver, the trace comprising:
      a plurality of first portions; and
      a plurality of second portions alternately coupled in series with the first portions, the second portions having a width that is different from that of the first portions,
   wherein the trace is configured to amplify reflection of the signal at a predetermined frequency.

2. The display device of claim 1, wherein the width of a first portion from among the first portions is constant from a first end of the first portion to a second end of the first portion, and
   the width of a second portion from among the second portions is constant from a first end of the second portion to a second end of the second portion.

3. The display device of claim 1, wherein the width of a first portion from among the first portions is smaller than the width of a second portion from among the second portions, and
   the width of the first portion increases from a first end of the first portion to a second end of the first portion, and the width of the second portion increases from a first end of the second portion to a second end of the second portion.

4. The display device of claim 1, wherein the width of a first portion from among the first portions is larger than the width of a second portion from among the second portions, and
   the width of the first portion decreases from a first end of the first portion to a second end of the first portion, and the width of the second portion decreases from a first end of the second portion to a second end of the second portion.

5. The display device of claim 1, wherein the trace comprises a plurality of periods, each of the periods comprising one of the first portions and an adjacent one of the second portions, and a length of each of the periods is equal to each other.

6. A circuit board comprising:
   a first terminal to be coupled to a transmitter;
   a second terminal to be coupled to a receiver;
   a channel coupled to the second terminal at a node, and configured to transmit a signal from the first terminal to the second terminal; and
   a trace coupled to the channel at the node between the first terminal and the second terminal, the trace comprising:
      a plurality of first portions; and
      a plurality of second portions alternately coupled in series with the first portions, the second portions having a width that is different from that of the first portions,
   wherein the trace is configured to amplify reflection of the signal at a predetermined frequency.

7. The circuit board of claim 6, wherein the width of a first portion from among the first portions is constant from a first end of the first portion to a second end of the first portion, and
   the width of a second portion from among the second portions is constant from a first end of the second portion to a second end of the second portion.

8. The circuit board of claim 6, wherein the width of a first portion from among the first portions is smaller than the width of a second portion from among the second portions, and
   the width of the first portion increases from a first end of the first portion to a second end of the first portion, and the width of the second portion increases from a first end of the second portion to a second end of the second portion.

9. The circuit board of claim 6, wherein the width of a first portion from among the first portions is larger than the width of a second portion from among the second portions, and
   the width of the first portion decreases from a first end of the first portion to a second end of the first portion, and the width of the second portion decreases from a first end of the second portion to a second end of the second portion.

10. The circuit board of claim 6, wherein the trace comprises a plurality of periods, each of the periods comprising one of the first portions and an adjacent one of the second portions, and a length of each of the periods is equal to each other.

11. A trace to be coupled to an input of a receiver, the trace comprising:
    a plurality of first portions; and
    a plurality of second portions alternately coupled in series with the first portions, the second portions having a width that is different from that of the first portions,
    wherein the trace is coupled to a channel at the input of the receiver, the channel being configured to transmit a signal to the input of the receiver, and
    wherein the trace is configured to amplify reflection of the signal at a predetermined frequency.

12. The trace of claim 11, wherein the width of a first portion from among the first portions is constant from a first end of the first portion to a second end of the first portion, and
    the width of a second portion from among the second portions is constant from a first end of the second portion to a second end of the second portion.

13. The trace of claim 12, wherein each one of the first portions and the second portions have a quadrilateral shape.

14. The trace of claim 11, wherein the width of a first portion from among the first portions is smaller than the width of a second portion from among the second portions, and
    the width of the first portion increases from a first end of the first portion to a second end of the first portion, and the width of the second portion increases from a first end of the second portion to a second end of the second portion.

15. The trace of claim 14, wherein each one of the first portions and the second portions have a trapezoidal shape.

16. The trace of claim 11, wherein the width of a first portion from among the first portions is larger than the width of a second portion from among the second portions, and
- the width of the first portion decreases from a first end of the first portion to a second end of the first portion, and
- the width of the second portion decreases from a first end of the second portion to a second end of the second portion.

17. The trace of claim 16, wherein each one of the first portions and the second portions have a trapezoidal shape.

18. The trace of claim 11 further comprising a plurality of periods, each of the periods comprising one of the first portions and an adjacent one of the second portions, and a length of each of the periods is equal to each other.

19. The trace of claim 18, wherein each of the first portions have a quadrilateral shape, each of the second portions have a quadrilateral shape, and the width of the first portions is smaller than the width of the second portions.

20. The trace of claim 18, wherein each of the periods have a trapezoidal shape.

\* \* \* \* \*